(12) United States Patent
Simin et al.

(10) Patent No.: US 9,391,189 B2
(45) Date of Patent: *Jul. 12, 2016

(54) LATERAL/VERTICAL SEMICONDUCTOR DEVICE

(71) Applicant: Sensor Electronic Technology, Inc., Columbia, SC (US)

(72) Inventors: Grigory Simin, Columbia, SC (US); Mikhail Gaevski, West Columbia, SC (US); Michael Shur, Latham, NY (US); Remigijus Gaska, Columbia, SC (US)

(73) Assignee: Sensor Electronic Technology, Inc., Columbia, SC (US)

(*) Notice: Subject to any disclaimer, the term of this patent is extended or adjusted under 35 U.S.C. 154(b) by 0 days.

This patent is subject to a terminal disclaimer.

(21) Appl. No.: 14/885,129

(22) Filed: Oct. 16, 2015

(65) Prior Publication Data

US 2016/0035871 A1 Feb. 4, 2016

Related U.S. Application Data

(63) Continuation-in-part of application No. 14/027,897, filed on Sep. 16, 2013, now Pat. No. 9,166,048.

(60) Provisional application No. 61/701,669, filed on Sep. 16, 2012, provisional application No. 61/840,600, filed on Jun. 28, 2013.

(51) Int. Cl.
  *H01L 21/20* (2006.01)
  *H01L 27/12* (2006.01)
  *H01L 29/78* (2006.01)
  (Continued)

(52) U.S. Cl.
  CPC ............ *H01L 29/78* (2013.01); *H01L 29/1087* (2013.01); *H01L 29/6609* (2013.01); *H01L 29/66446* (2013.01); *H01L 29/66477* (2013.01); *H01L 29/7786* (2013.01); *H01L 29/7838* (2013.01); *H01L 29/861* (2013.01); *H01L 29/8613* (2013.01); *H01L 29/872* (2013.01); *H01L 29/93* (2013.01); *H01L 23/367* (2013.01); *H01L 29/0623* (2013.01); *H01L 29/2003* (2013.01); *H01L 29/402* (2013.01); *H01L 29/41758* (2013.01); *H01L 29/41766* (2013.01);
  (Continued)

(58) Field of Classification Search
  CPC .................................................. H01L 29/7838
  USPC .................................. 257/348, 598; 438/379
  See application file for complete search history.

(56) References Cited

U.S. PATENT DOCUMENTS 5,396,085 A 3/1995 Baliga
5,909,139 A 6/1999 Williams
(Continued)

OTHER PUBLICATIONS

Lee, C., U.S. Appl. No. 14/027,897, Notice of Allowance, Jun. 22, 2015, 12 pages.
(Continued)

*Primary Examiner* — Calvin Lee
(74) *Attorney, Agent, or Firm* — LaBatt, LLC

(57) ABSTRACT

A lateral semiconductor device and/or design including a space-charge generating layer and a set of electrodes located on an opposite side of a device channel as contacts to the device channel is provided. The space-charge generating layer is configured to form a space-charge region to at least partially deplete the device channel in response to an operating voltage being applied to the contacts to the device channel.

20 Claims, 11 Drawing Sheets

(51) Int. Cl.
*H01L 29/861* (2006.01)
*H01L 29/66* (2006.01)
*H01L 29/778* (2006.01)
*H01L 29/872* (2006.01)
*H01L 29/93* (2006.01)
*H01L 29/10* (2006.01)
*H01L 23/367* (2006.01)
*H01L 29/40* (2006.01)
*H01L 29/417* (2006.01)
*H01L 29/06* (2006.01)
*H01L 29/20* (2006.01)
*H01L 29/423* (2006.01)

(52) U.S. Cl.
CPC ....... *H01L 29/42316* (2013.01); *H01L 29/7831* (2013.01); *H01L 2924/0002* (2013.01)

(56) References Cited

U.S. PATENT DOCUMENTS

| | | | |
|---|---|---|---|
| 5,973,338 A | 10/1999 | Okabe et al. | |
| 7,092,291 B2 | 8/2006 | Mori | |
| 7,782,118 B2 | 8/2010 | Reichl et al. | |
| 7,982,239 B2 * | 7/2011 | McNutt et al. | H01L 21/8232 257/109 |
| 8,597,059 B2 | 12/2013 | Bucheru et al. | |
| 8,610,234 B2 | 12/2013 | Kim | |
| 9,166,048 B2 * | 10/2015 | Simin | H01L 29/7786 438/379 |
| 2012/0205667 A1 | 8/2012 | Simin et al. | |

OTHER PUBLICATIONS

Lee, C., U.S. Appl. No. 14/027,897, Office Action 1, Mar. 6, 2015, 8 pages.

Feiler, et al., "Multistep field plates for high-voltage planar p-n junctions," IEEE Trans. Electron Devices, vol. 39, No. 6, Jun. 1992, pp. 1514-1520.

Karmalkar, et al., "Enhancement of breakdown voltage in AlGaN/GaN high electron mobility transistors using a field plate," Electron Devices, IEEE Transactions, vol. 48, No. 8, 2001, pp. 1515-1521.

Saito, et al., "Theoretical limit estimation of lateral wide band-gap semiconductor power-switching device," Solid-State Electronics, vol. 48, No. 9, Sep. 2004, pp. 1555-1562.

* cited by examiner

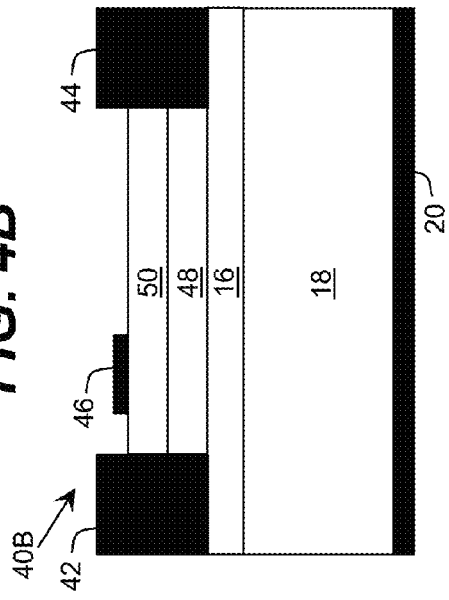
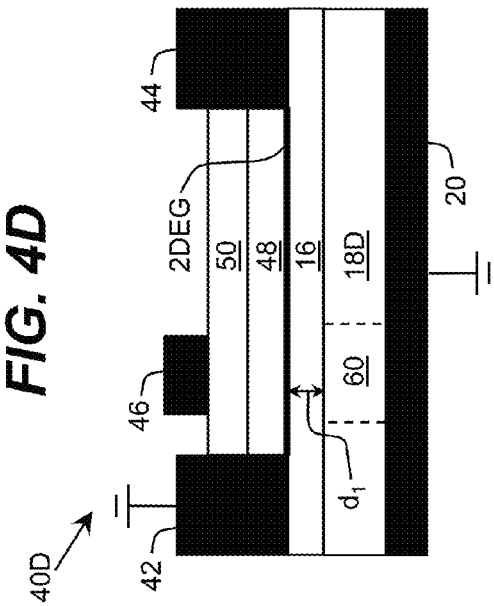
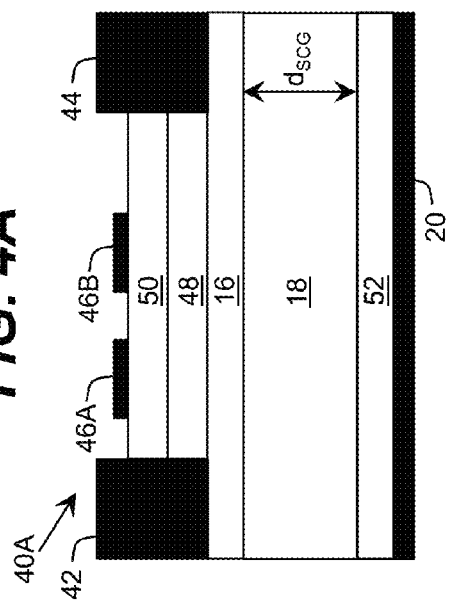
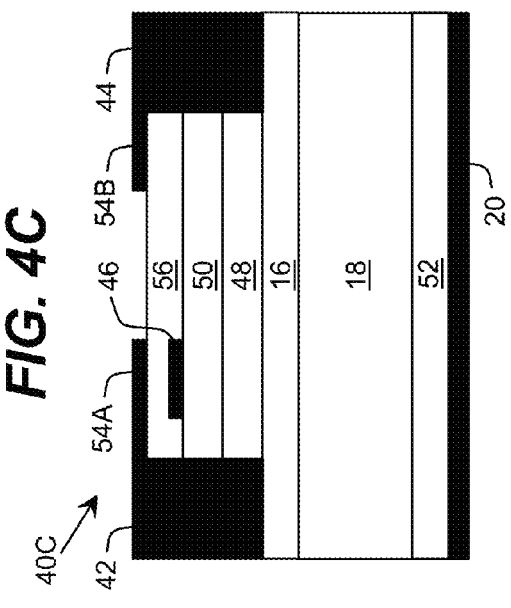

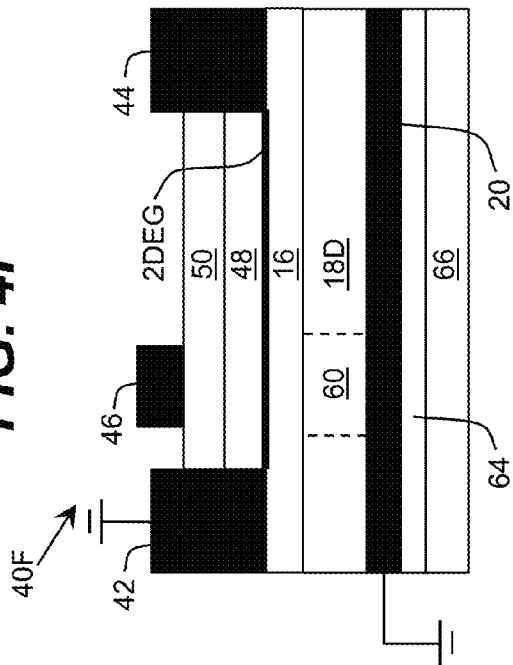
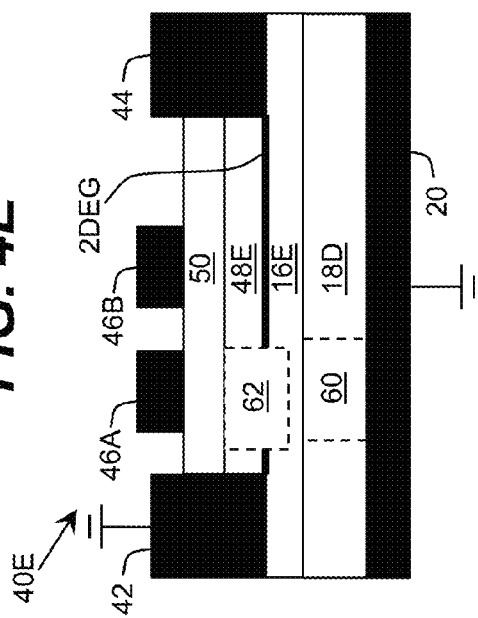
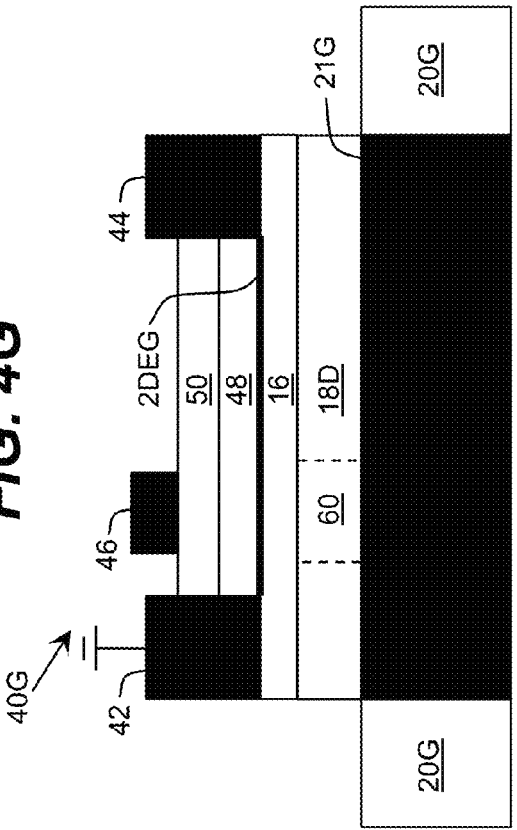

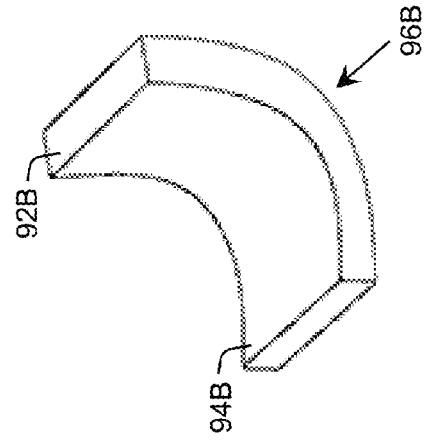
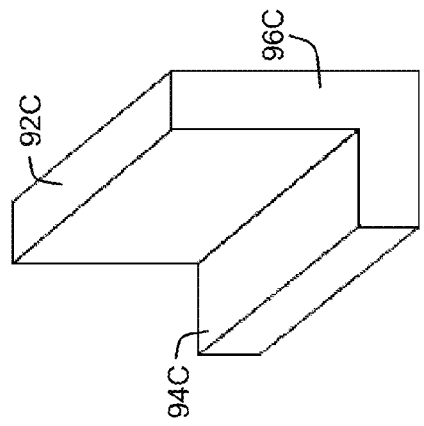
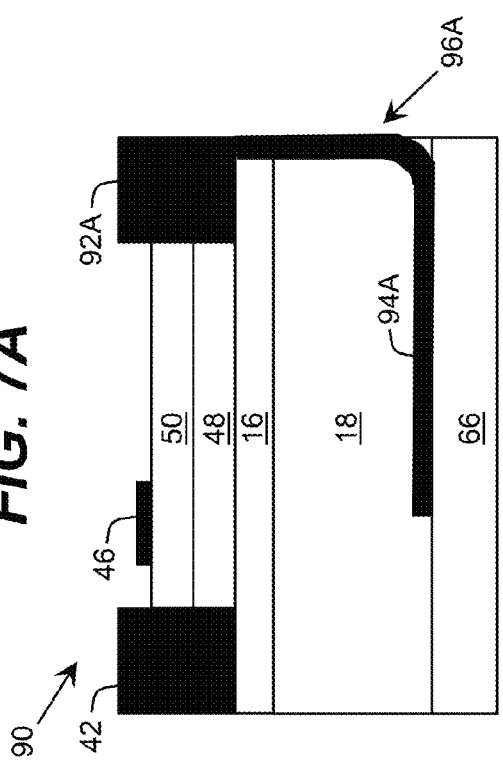

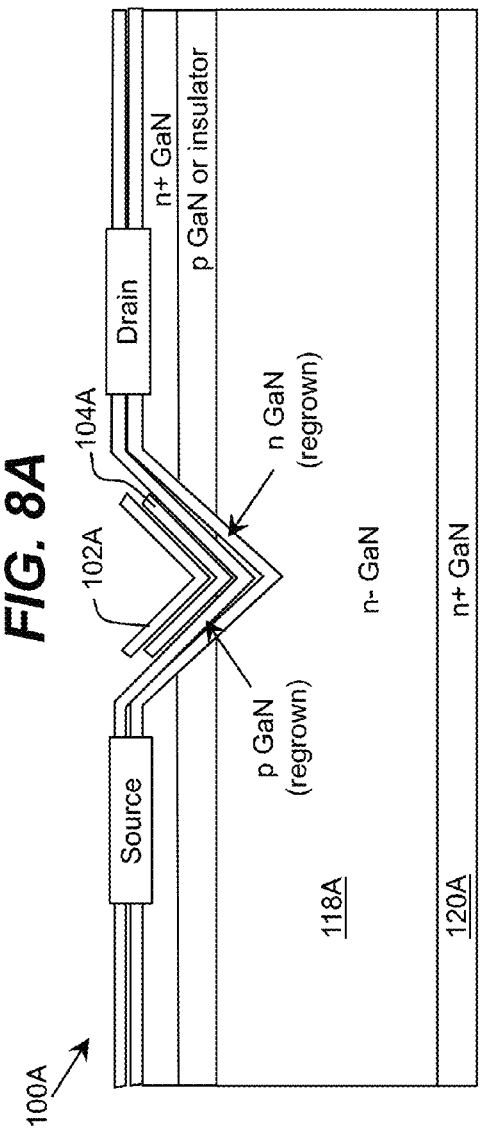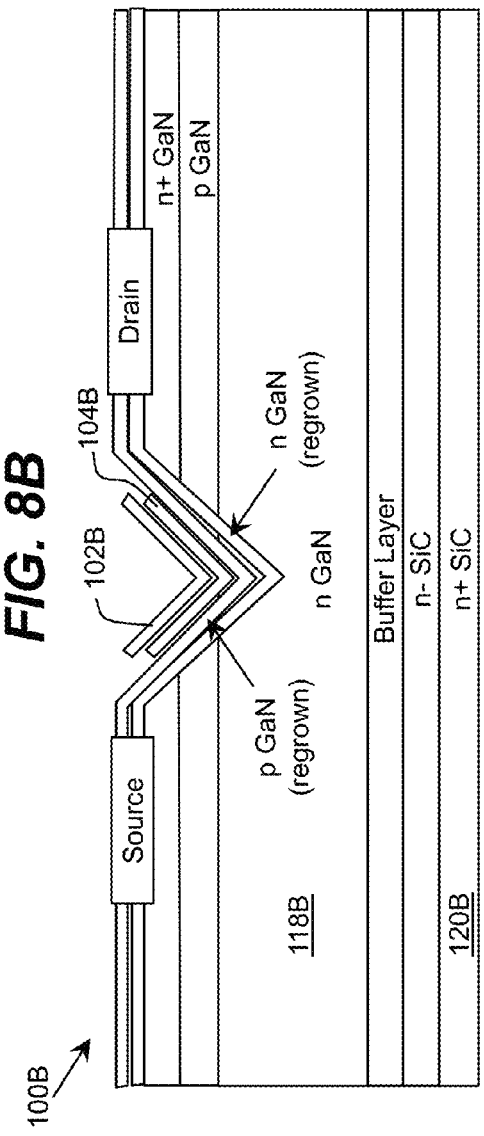

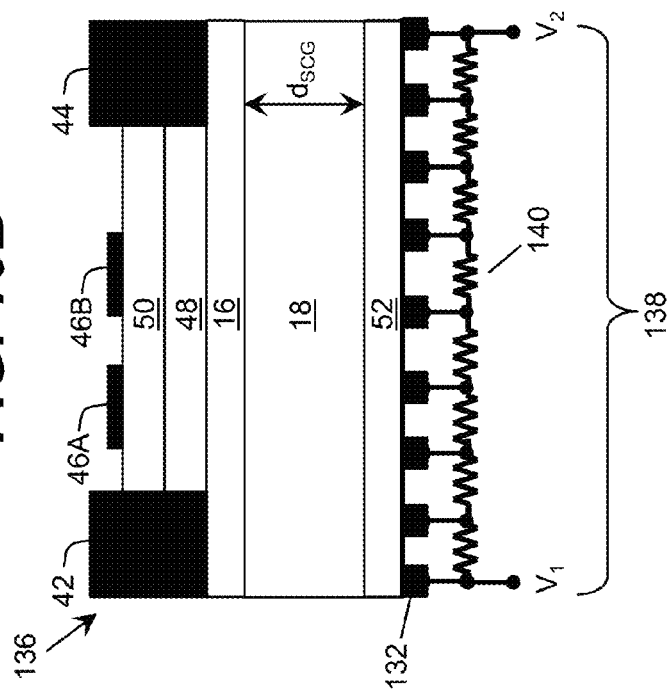
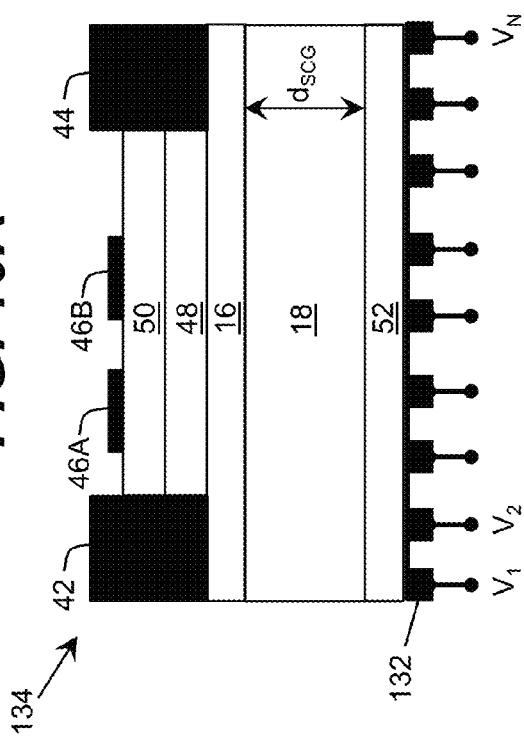
FIG. 10A
FIG. 10B

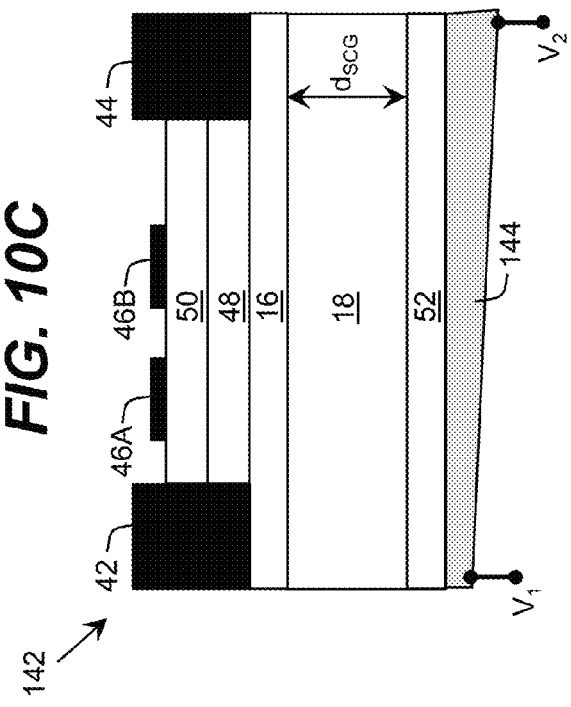
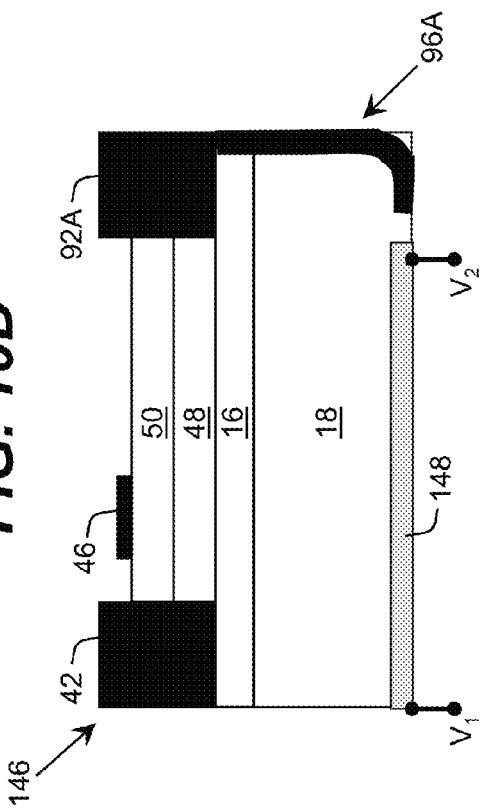

LATERAL/VERTICAL SEMICONDUCTOR DEVICE

REFERENCE TO RELATED APPLICATIONS

The present patent application is a continuation-in-part application of U.S. application Ser. No. 14/027,897, titled "Lateral/Vertical Semiconductor Device," which was filed on 16 Sep. 2013, now U.S. Pat. No. 9,166,048, issued 20 Oct. 2015, which claims the benefit of U.S. Provisional Application No. 61/701,669, titled "Lateral/Vertical Semiconductor Device," which was filed on 16 Sep. 2012, and U.S. Provisional Application No. 61/840,600, titled "Lateral/Vertical Semiconductor Device," which was filed on 28 Jun. 2013, each of which is hereby incorporated by reference in its entirety.

TECHNICAL FIELD

The disclosure relates generally to semiconductor devices, and more particularly, to increasing operating voltage and maximum power of semiconductor devices.

BACKGROUND ART

In power semiconductor devices, achieving the highest breakdown voltage simultaneously with minimal on-resistance is one of the most important performance characteristics. Lateral geometry devices, such as field-effect transistors (FETs), including metal oxide semiconductor FETs (MOSFETs), metal semiconductor FETs (MESFETs), high electron mobility transistors (HEMTs), etc., have a channel aligned along the semiconductor surface, and which is often located close to the semiconductor surface. If the space-charge (depletion) region occupies only a portion of the gate-drain spacing, the electric field in that spacing is strongly non-uniform and can result in premature breakdown, which limits the device performance. Due to a high carrier concentration in the channel and the close vicinity of the channel to the semiconductor surface, efficient control over the space charge distribution in the gate-drain spacing is extremely challenging.

FIG. 1A shows a conventional heterostructure FET (HFET) 2A according to the prior art, and FIG. 2 shows an illustrative electric field distribution chart according to the prior art. As illustrated in FIG. 2, the electric field profile in the gate-drain spacing having a distance, LGD, shown in FIG. 1A exhibits a strong peak near the gate edge when the HFET 2A is operated as a switch (without a field plate). The peak width is defined by the carrier concentration in the channel. To this extent, a breakdown voltage for the HFET 2A does not increase when the gate-drain spacing distance LGD is increased.

One approach to lower the peak electric field near the gate edge is the use of one or more field-modulating plates (FPs), which can be connected to either the gate, source, or drain electrode. FIG. 1B shows a conventional heterostructure FET (HFET) 2B including a field plate FP according to the prior art. As illustrated in FIG. 2, the field plate structure decreases the peak field near the gate electrode edge by splitting it into two peaks, thereby increasing the breakdown voltage for the device. However, even multiple field plate structures, which split the electric field into even more peaks, cannot achieve a uniform electric field in the device channel.

Additionally, optimal configuration of multiple field plates is difficult to achieve. For example, the optimal configuration requires precisely controlled field plate length and dielectric thickness variation along the channel. In addition, prior art field plates have either source or gate potential applied to them, and therefore significant voltage exists between the field plate and the drain electrode. As a result, a device including field plate(s) can suffer from premature breakdown between the field plate(s) and the drain electrode. Furthermore, the field plate(s) increases the inter-electrode and electrode-semiconductor capacitances and therefore decreases the device maximum operating frequency.

As a result of the above limitations, current high-voltage FET switches (i) do not achieve the breakdown voltages predicted by fundamental material properties and (ii) exhibit breakdown voltage—gate-drain spacing dependence saturating at high voltages, typically four hundred volts and above, which imposes serious limitations on device design for kilovolt switching applications.

SUMMARY OF THE INVENTION

Aspects of the invention provide a lateral semiconductor device and/or design including a space-charge generating layer and a set of electrodes or a low conducting electrode located on an opposite side of a device channel as contacts to the device channel. The space-charge generating layer is configured to form a space-charge region to at least partially deplete the device channel in response to an operating voltage being applied to the contacts to the device channel.

A first aspect of the invention provides a lateral semiconductor device comprising: a device channel; a first contact on a first end of the device channel; a second contact on a second end of the device channel, wherein the second end is opposite the first end, and wherein the first and second contacts are located on a first side of the device channel; a space-charge generating layer located on a second side of the device channel opposite the first side; and a set of electrodes electrically connected to the space-charge generating layer and located on an opposite side of the space-charge generating layer as the device channel, wherein the space-charge generating layer has a set of attributes configured to form a space-charge region to at least partially deplete the device channel in response to an operating voltage being applied to the first contact and the second contact.

A second aspect of the invention provides a circuit comprising: a lateral semiconductor device comprising: a device channel; a first contact on a first end of the device channel; a second contact on a second end of the device channel, wherein the second end is opposite the first end, and wherein the first and second contacts are located on a first side of the device channel; a space-charge generating layer located on a second side of the device channel opposite the first side; and a set of electrodes electrically connected to the space-charge generating layer and located on an opposite side of the space-charge generating layer as the device channel; a input circuit electrically connected to the first contact; and an output circuit electrically connected to the second contact, wherein the space-charge generating layer has a set of attributes configured to form a space-charge region to at least partially deplete the device channel in response to an operating voltage being applied to the first contact and the second contact.

A third aspect of the invention provides a method comprising: designing a lateral semiconductor device comprising: a device channel; a first contact on a first end of the device channel; a second contact on a second end of the device channel, wherein the second end is opposite the first end, and wherein the first and second contacts are located on a first side of the device channel; a space-charge generating layer located on a second side of the device channel opposite the first side;

and a set of electrodes electrically connected to the space-charge generating layer and located on an opposite side of the space-charge generating layer as the device channel, wherein the designing includes selecting a set of attributes for the space-charge generating layer such that the space-charge generating layer is configured to form a space-charge region to at least partially deplete the device channel in response to an operating voltage being applied to the first contact and the second contact; and fabricating the lateral semiconductor device according to the design.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 4A-4G show illustrative field effect transistor devices according to embodiments.

FIGS. 7A-7C illustrate a device in which the drain electrode is electrically connected to a bottom electrode via a vertical connecting electrode and alternative electrode configurations according embodiments.

FIGS. 8A-8B show illustrative devices with V-groove gates according to embodiments.

FIGS. 10A-10D show illustrative field effect transistor devices each having a set of electrodes connected to a space-charge generating layer according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

The inventors propose a semiconductor device design, which can provide a solution for increasing an operating voltage and/or maximum power of a semiconductor device over previous design approaches. An embodiment provides a lateral (planar) semiconductor device, which can combine a relatively high breakdown voltage achievable in vertical geometry devices and a relatively low on-resistance achievable in a high mobility, high electron density two dimensional electron gas. In one embodiment, a device can include vertical and surface space charge control regions controlled by multiple electrodes to reduce both surface and bulk electric field components over those present in prior art devices. Having the surface space charge control regions controlled by multiple electrodes results in a more uniform electric field in the channel of the device and beneath it, and therefore, a higher breakdown voltage for a given channel length. Further, a reduction of the electric field components to their theoretical minimum, allows for the highest breakdown voltage and shortest gate-drain spacing, and hence, the lowest on-resistance in comparison to prior art devices. In another embodiment, the device can have the space charge control regions controlled by a low conducting electrode providing a continuously variable potential profile. This low conducting electrode that provides a continuously variable potential profile enables control of the electric field profile along and beneath the channel of the device to achieve a uniform electric field thereat.

As indicated above, aspects of the invention provide a lateral semiconductor device and/or design can include a space-charge generating layer and a set of electrodes located on an opposite side of a device channel as contacts to the device channel. The space-charge generating layer is configured to form a space-charge region to at least partially deplete the device channel in response to an operating voltage being applied to the contacts to the device channel.

As used herein, unless otherwise noted, the term "set" means one or more (i.e., at least one) and the phrase "any solution" means any now known or later developed solution. Furthermore, as used herein, a normally-on device channel means a device channel that is in a conducting state when no external voltage or electric field is applied to it, and a normally-off device channel means a device channel that is in a non-conducting state when no external voltage or electric field is applied to it. As also used herein, an insulating material means a material having a resistivity above $10^{10}$ Ohm×cm; a semi-insulating material means a material having a resistivity in a range of $10^{10}$-$10^5$ Ohm×cm; a semiconductor means a material having a resistivity in a range of $10^5$-$10^{-3}$ Ohm×cm; and a metal or semi-metal means a material having a resistivity below $10^{-3}$ Ohm×cm.

Figure 2:
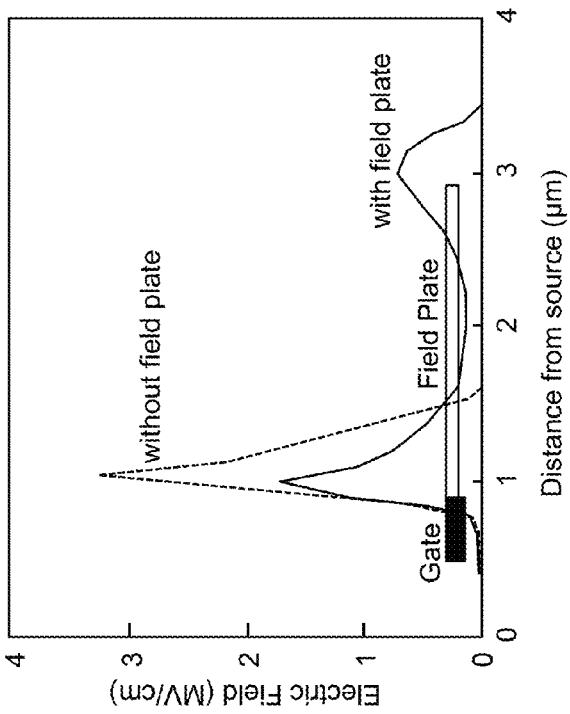
FIG. 2 shows an illustrative electric field distribution chart according to the prior art.
Figure 1A:
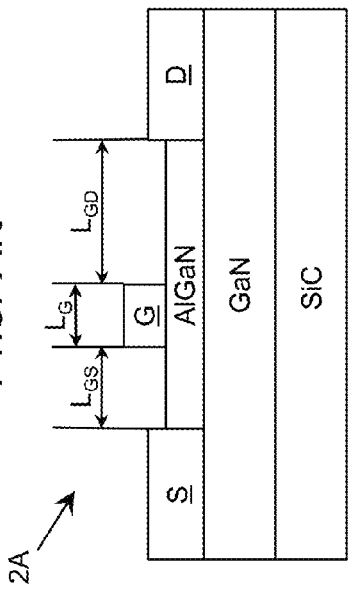
FIGS. 1A-1B show conventional heterostructure field effect transistors according to the prior art.
Figure 1B:
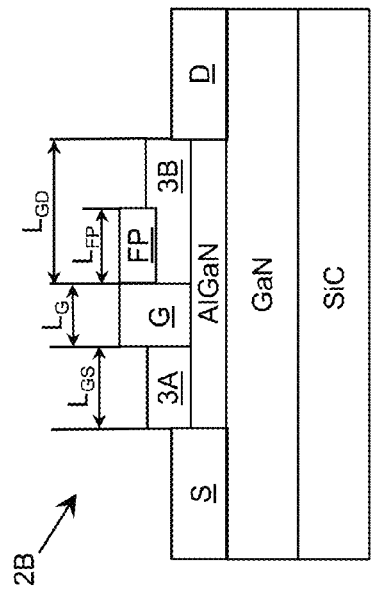
Figure 3B:
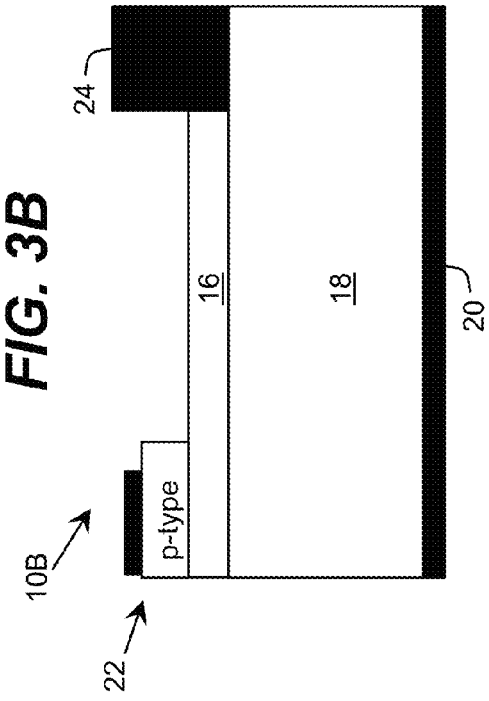
FIGS. 3A-3D show illustrative diode devices according to embodiments.
Figure 3D:
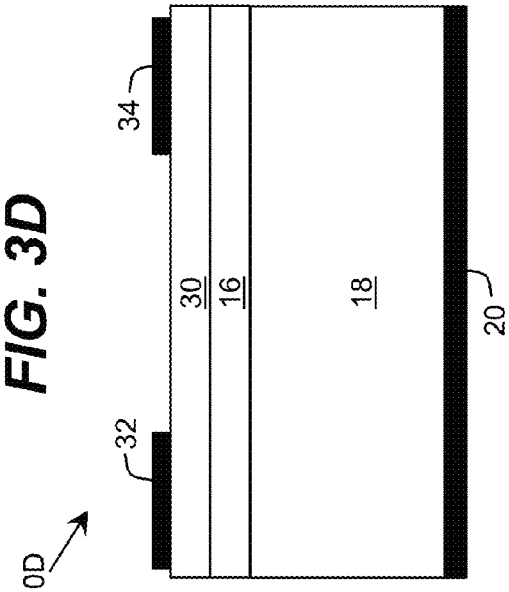
Figure 3A:
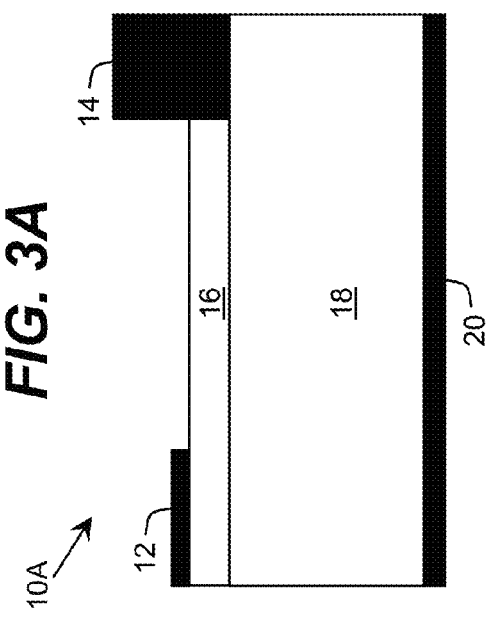

In general, aspects of the invention provide a lateral geometry device including an additional mechanism to control the channel depletion in the electrode spacing. In an embodiment, the device is configured to operate as a diode. For example, FIG. 3A shows an illustrative device 10A, which can be configured to operate as a Schottky diode, according to an embodiment. To this extent, the device 10A is shown including a Schottky (source) contact 12 and an ohmic (drain) contact 14 to a device channel 16 in a lateral device geometry (lateral device contacts). The device channel 16 is formed on a first side of an n-type space-charge generating layer 18. The device 10A also includes an electrode 20 attached to an opposing side of the space-charge generating layer 18. In an embodiment, the electrode 20 is a non-ohmic contact to the space-charge generating layer 18, and also can be a Schottky contact. As used herein, a Schottky contact includes a non-ideal Schottky contact.

Figure 3C:
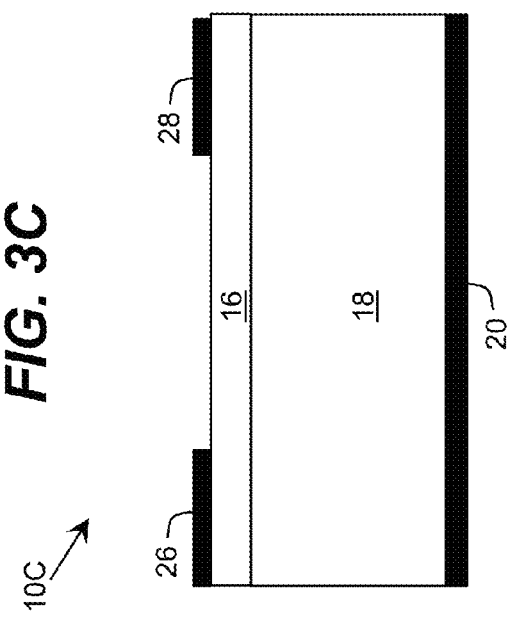

It is understood that device 10A is only illustrative of various types of diodes and diode configurations, which can be implemented according to embodiments. To this extent, aspects of the invention provide various types of diodes. For example, FIG. 3B shows an illustrative device 10B, which can be operated as a junction diode, according to another embodiment. In this case, the device 10B is shown including a p-n junction anode contact 22 and an ohmic cathode contact 24 to the n-type device channel 16. Furthermore, FIG. 3C shows an illustrative device 10C, which can be operated as a metal-semiconductor-metal (MSM) diode, according to another embodiment. In this case, the device 100 is shown including a pair of symmetrical Schottky contacts 26, 28 to the device channel 16. FIG. 3D shows another illustrative device 10D, which can be operated as a capacitively coupled contact ($C^3$) diode (varactor diode), according to an embodiment. In this case, the device 10D is shown including an insulating layer 30 formed of an insulating material (e.g., a dielectric), which is located on the device channel 16. Additionally, a pair of symmetrical capacitively coupled contacts 30, 32 are shown located on the insulating layer 30.

Furthermore, it is understood that a diode is only illustrative of various types of devices and device configurations, which can be implemented according to embodiments. To this extent, aspects of the invention provide various types of field effect transistors. For example, FIG. 4A shows an illustrative device 40A, which can be operated as a field-effect transistor, according to an embodiment. In this case, the device 40A is shown including a space-charge generating layer 18 and a device channel 16 (e.g., built in or induced) on which a set of lateral device contacts are located. The lateral device contacts include a source contact 42, a drain contact 44, and two gate contacts 46A, 46B. The gate contacts 46A, 46B are located on a top barrier layer 48 and a gate dielectric layer 50, which are located in the spacing between the source contact 42 and the drain contact 44.

The device 40A also can include a potential barrier formed between the bottom electrode 20 and the space-charge generating layer 18. For example, the device 40A is shown including a bottom barrier layer 52 below which the electrode 20 is located. The bottom barrier layer 52 can form the potential barrier between the bottom electrode 20 and the space-charge generating layer 18 using any solution, e.g., a p-n junction (e.g., the barrier layer 52 is a p-type layer, while the space-charge generating layer 18 is an n-type layer), a heterojunction, and/or the like.

It is understood that the configuration of the device 40A is only illustrative. To this extent, other embodiments can provide a device with a single gate contact and/or without one or more of: the top barrier layer 48; the gate dielectric layer 50; the bottom barrier layer 52; and/or the like. For example, FIG. 4B shows an illustrative device 40B, which can be operated as a field-effect transistor, according to an embodiment. In this case, the device 40B is configured similar to the device 40A (FIG. 4A), but includes a single gate 46 and does not include the bottom barrier layer 52 (FIG. 4A). To this extent, the electrode 20 can comprise a Schottky contact.

Additionally, other embodiments can provide a device with one or more additional design features to further improve the performed of the device. For example, FIG. 4C shows an illustrative device 40C, which can be operated as a field-effect transistor, according to an embodiment. In this case, the device 40C is configured similar to the device 40A (FIG. 4A), but includes a single gate 46. An isolation layer 54 (e.g., a layer of a dielectric material) is located on the gate 46 and the gate dielectric layer 50, and a source surface structure 54A and a drain surface structure 54B are located on the isolation layer 56. In an embodiment, the surface structures 54A, 54B are field plates. In this case, during operation of the device 40C, the field plates 54A, 54B can reduce electric field non-uniformities at the edges of the source contact 42 and drain contact 44, respectively. In another embodiment, one or both surface structures 54A, 54B are formed of a low conducting layer of material. The low conducting layer can have a sheet resistance between approximately $10^3$ Ohms per square and approximately $10^7$ Ohms per square and can have a characteristic charging-recharging time larger than $1/(2\pi f_{MIN})$, where $f_{MIN}$ is a lowest target operating frequency for the device 40C. Furthermore, the low conducting layer can be contacting any combination of zero or more of the gate 46, the source contact 42, and/or the drain contact 44.

In an embodiment, the device can be configured to include a normally-off device channel. For example, the space-charge generating layer 18 can have a non-uniform doping, composition, composition grading, and/or the like. FIG. 4D shows an illustrative device 40D, which can be operated as a normally-off field effect transistor, according to an embodiment. In this case, an n-type space-charge generating layer 18D includes a p-type region 60 embedded therein, which is located under a gate 46 of the device 40D. A potential barrier at an interface between the p-type region 60 and the channel 16 depletes the channel 16, thereby enabling the device 40D to be operated as a normally-off field effect transistor (e.g., a HFET, MISHFET, and/or the like). FIG. 4E shows another illustrative device 40E, which can be operated as a normally-off field effect transistor, according to an embodiment. In this case, the device 40E is shown including two gates 46A, 46B and a space-charge generating layer 18D including the embedded p-type region 60 described herein. Additionally, the channel layer 16E and top barrier layer 48E include an embedded region 62 located under one of the gates 46A, in which one or more modifications are made to create a normally-off device channel. Illustrative modifications include one or more of: a change in composition, a doping, implanted charges, and/or the like.

A device also can include one or more additional design features to assist with prolonging an operating life of the device, integrating the device in a circuit, and/or the like. To this extent, a device can include one or more heat sink elements to remove excess heat, which can accumulate during operation of the device. For example, FIG. 4F shows an illustrative device 40F, which can be operated as a normally-off field effect transistor, according to an embodiment. The device 40F includes a heat spreading layer 64 located adjacent to the electrode 20 on a side opposite of the space-charge generating layer 18D and a heat sink 66 located adjacent to the heat spreading layer 64. FIG. 4G shows still another illustrative device 40G, which can be operated as a normally-off field effect transistor, according to an embodiment. The device 40G includes a substrate 20G having a via-hole 21G included therein. The substrate 20G can be formed of silicon, sapphire, and/or the like.

While certain design features are only shown in conjunction with a particular device configuration, it is understood that each feature described herein can be incorporated on a corresponding device design. For example, a diode 10A-10D described herein can include a potential barrier formed between the bottom electrode 20 and the space-charge generating layer 18.

During operation of a device described herein (e.g., a diode 10A-10D, a field-effect transistor 40A-40G, and/or the like, which are subsequently collectively referred to as a device 10, 40), the space-charge generating layer 18 and the electrode 20 can form a reverse biased junction when an operating voltage of the device 10, 40 is applied to the lateral device contacts. The reverse biased junction can provide control of the channel depletion in the electrode spacing. For example, the reverse biased junction can form a space-charge region in the space-charge generating layer 18. In an embodiment, a thickness, composition, doping type, profile, and/or the like, in the space-charge generating layer 18 are selected such that, at a maximum operating voltage for the device 10, 40, the space-charge region extends over substantially all of the space-charge generating layer 18 and at least partially depletes the device channel 16.

The space-charge generating layer 18 can be configured to include a space-charge generating and voltage blocking region. For example, when implemented in a circuit, the electrode 20 can have the same applied voltage as a source contact (e.g., as shown in FIGS. 4D-4G), although the electrode 20 also can have the gate voltage or a floating potential. When the device 10, 40 is in the on state, current flows in the (highly conducting) device channel 16 between the lateral source and drain contacts. When the device 10, 40 is in the off state, the device electric field is primarily controlled by the space-charge generated in a vertical voltage blocking region formed in the space-charge generating layer 18 between the electrode 20 and the drain contact located on the opposing side of the space-charge generating layer 18. For example, as a voltage across the device 10, 40 increases (e.g., a voltage between the Schottky and Ohmic contacts in a Schottky diode, between the anode and cathode in a junction diode, between electrodes in MSM and varactor diodes, the drain voltage in a FET, and/or the like), a voltage between the bottom electrode 20 and the high voltage contact (e.g., a drain contact of a FET) also increases. The latter increase in voltage causes a depletion region to develop in the space-charge generating layer 18 and enlarge as the voltage increases. When the depletion region in the space-charge generating layer 18 reaches the device channel 16 and further enlarges, the depletion region depletes the device channel 16 thereby enforcing full depletion of the device channel 16.

Using the device 40A shown in FIG. 4A as an illustrative example, various aspects of configuring a device described herein are described. A thickness of the space-charge generating layer 18, $d_{SCG}$, is measured between the interfaces of the bottom barrier layer 52 and the channel 16 with the space-charge generating layer 18 for the device 40A. In other device configurations, the thickness $d_{SCG}$ can be measured differently. For example, when the electrode 20 is a Schottky contact and the device is an HFET, $d_{SCG}$ corresponds to a distance between electrode 20 and a two-dimensional electron gas (2DEG) plane. In the case of an HFET device including a p-n junction forming the bottom barrier layer 52, $d_{SCG}$ corresponds to a distance between the p-n junction interface and the 2DEG plane, and/or the like.

Regardless, $d_{SCG}$ can be selected to ensure the channel depletion and to prevent breakdown in the space-charge generating layer 18. Assuming the electrode 20 has a zero voltage potential and for a maximum drain operating voltage for the device, $V_{DM}$, $d_{SCG}$ can be calculated as:

$$d_{SCG} = \frac{2V_{DM}}{E_M} \quad (1)$$

where $E_M$ is a maximum allowable field in the space-charge generating layer 18. In an embodiment, $E_M$ is less than the breakdown field for the space-charge generating layer 18, $E_{BD}$. In a more particular embodiment, $E_M \approx (0.5-0.7) \times E_{BD}$.

A doping level, $N_D$, and a doping profile in the space-charge generating layer 18 can be configured to deplete the channel 16 near the drain contact 44 at a maximum drain voltage, $V_{DM}$. As an example, for uniform doping of the space-charge generating layer 18, the doping level, $N_D$, can be calculated as:

$$N_D = \frac{\varepsilon \varepsilon_0 E_M^2}{q(V_{DM} - V_{BI} - V_{PO})} \quad (2)$$

where $V_{BI}$ is a built-in voltage of the bottom barrier layer 18; $V_{PO}$ is the pinch-off voltage of the channel 16 near the drain contact 44; q is the elementary charge; $\varepsilon$ is the relative dielectric permittivity of the space-charge generating layer 18; and $\varepsilon_0$ is vacuum permittivity. For a general case of a non-uniform doping profile in the space-charge generating layer 18, the doping can be configured to meet following condition:

$$V_{DM} - V_{BI} - V_{PO} = \int_0^{d_{SCG}} dy \int_0^{d_{SCG}} \frac{qN_D(y)}{\varepsilon \varepsilon_0} dy \quad (3)$$

As a more particular illustrative example, a design for the space-charge generating layer 18 for a high voltage power HFET is described. For example, the HFET can comprise a GaN based HFET configured to operate at a maximum drain voltage of 600 Volts, having a breakdown field $E_{BD}=3$ MV/cm, and a relative dielectric permittivity of the GaN, $\varepsilon = 8.9$. Assuming: a maximum safe field in the space-charge generating layer 18, $E_M = 2$ MV/cm; the bottom barrier is formed by a Schottky contact; $V_{BI}=1$ Volt; a channel pinch-off voltage, $V_{PO}=4$ V; and a uniform doping of the space-charge generating layer 18, using formula (1): $d_{SCG}=6 \times 10^{-4}$ cm=6 μm; and using formula (2): $N_D=3.3 \times 10^{16}$ cm$^{-3}$. The built-in voltage, $V_{BI}$, in the space-charge generating layer 18 is dependent on the technology used to produce the potential barrier. For example, if the bottom barrier is produced by a p-n junction, the built-in voltage of the p-n junction can be used to determine the doping of the space-charge generating layer 18.

Turning to FIG. 4D and the device 40D as another illustrative device, for a space-charge generating layer 18D including the embedded p-type region 60 below the gate 46, one or more additional design considerations can be taken into account to ensure depletion of the channel under the gate 46 at a zero gate bias. For example, a distance from the p-type region 60 to the two dimensional electron gas (2DEG), $d_1$, and a doping level in the region of the channel 16 located between the p-type region 60 and the 2DEG, $N_{D1}$, can be configured to meet the following condition:

$$N_D = \frac{2\varepsilon\varepsilon_0(V_{PO} + V_{TO} - V_{BI-TOP})}{qd_1^2} \quad (4)$$

where $V_{TO}$ is a required turn-on voltage of the device 40D and $V_{BI-TOP}$ is a built-in voltage of the top gate electrode 46 with respect to the channel (e.g., 2DEG channel, doped channel, and/or the like).

The various devices 10, 40 described herein can be formed using any solution. To this extent, the space-charge generating layer 18 can be made of: a single crystal semiconductor; textured, poly-crystalline, amorphous, or semi-metal materials; a combination of layers/materials; and/or the like. Formation of the space-charge generating layer 18 can use any approach to form a semiconductor layer having the set of desired composition and/or doping profiles. Such approaches include: growth as part of a material growth process; depositing the growth materials using epitaxial growth methods; diffusion; ion implantation; and/or the like. The space-charge generating layer 18 can have a non-uniform doping, a non-uniform composition (e.g., a graded composition), and/or the like. In an embodiment, the space-charge generating layer 18 includes one or more features, such as a superlattice or other type of heterostructure, to also manage strain, polarization charge, defect concentration, and/or the like, in the device 10, 40.

In an embodiment, a device 10, 40 described herein is a group III-nitride based device. In this case, the channel 16 and space-charge generating layer 18 are formed of group III-nitride materials, such as gallium nitride (GaN), aluminum gallium nitride (AlGaN), indium nitride (InN), AlInN, AlGaInN, and/or the like. For example, the space-charge generating layer 18 can comprise a low-doped buffer layer, such as an n-type GaN layer grown over bulk GaN material. The doping profile and/or composition in the space-charge generating layer 18 can be designed to induce channel depletion under the drain at an operating voltage for the device 10, 40. The device channel 16 can comprise a AlIn(Ga)N/GaN heterostructure, which can be grown on the space-charge generating layer 18. For an HFET (or MISHFET) device, such as device 40A shown in FIG. 4A, the device channel 16 can comprise GaN and the barrier layer 48 can comprise AlInGaN. It is understood that while group III-nitride based devices are used to illustrate aspects of the invention, aspects of the invention are equally applicable to devices made from other types of semiconductor materials. The remaining components of the devices can be formed using any known suitable materials.

Figure 5A:
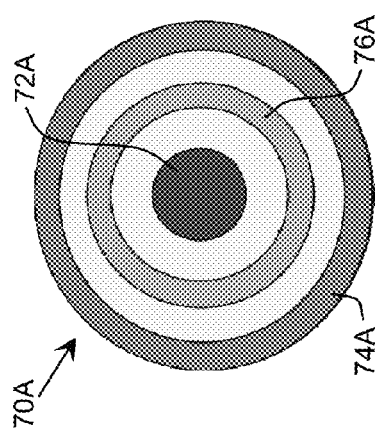
FIGS. 5A-5B show top views of illustrative devices according to embodiments.
Figure 5B:
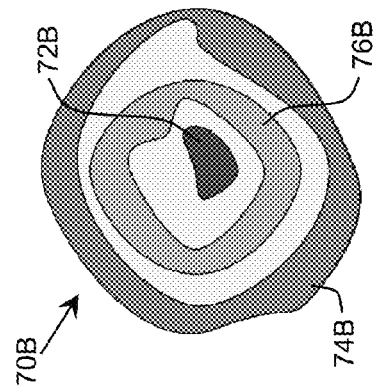

One or more aspects of the lateral topology of a device described herein can be configured to control the electric field. For example, FIGS. 5A and 5B show top views of illustrative devices 70A, 70B according to embodiments. In this case, the source electrodes 72A, 72B are topologically equivalent to a circle. Additionally, the drain electrodes 74A, 74B and the gate electrodes 76A, 76B are shown forming rings around the corresponding source electrodes 72A, 72B, with each gate electrode 76A, 76B being enclosed by the ring formed by the corresponding drain electrode 74A, 74B, respectively. It is understood that the various electrodes of the devices 70A, 70B are only topologically equivalent to the corresponding shapes (circles or rings), e.g., as shown in conjunction with the device 70B. As used herein, the term "topologically equivalent" means a geometrical shape that can be obtained from the respective shape (e.g., a ring or a circle) by continuous transformation of the respective shape, where the continuous transformation does not include cutting or reconnecting the shape but refers to shape stretching.

Figure 6B:
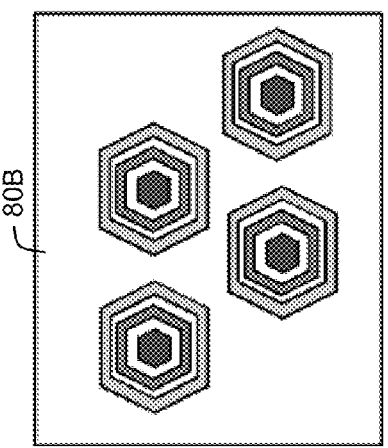
FIGS. 6A-6C show top views of illustrative devices according to embodiments.
Figure 6C:
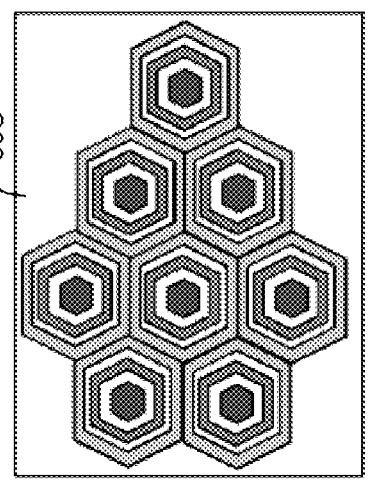
Figure 6A:
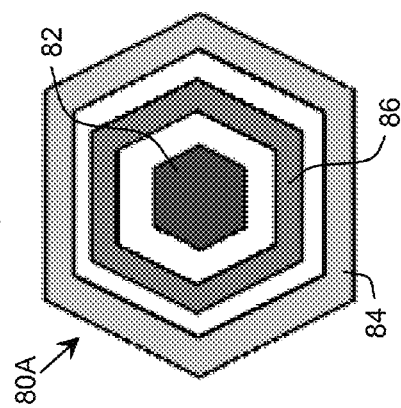

FIGS. 6A-6C show top views of illustrative devices 80A-80C according to embodiments. As indicated in FIG. 6A, a source electrode 82 has a shape of a hexagon, while the drain electrode 84 and the gate electrode 86 are in a shape of hexagonal rings. As defined herein, a hexagonal shape is topologically equivalent to a circle and a hexagonal ring is topologically equivalent to a ring. A device described herein can include more than one set of lateral electrodes (e.g., drain-gate-source electrodes). To this extent, FIGS. 6B and 6C show illustrative devices 80B, 80C with multiple sets of lateral electrodes. The electrodes in each set of lateral electrodes are shown positioned in various lateral positions on the device 80B, 80C. In an embodiment, each set of lateral electrodes are positioned along a lattice, such as a rectangular lattice, a hexagonal lattice (as shown in FIG. 6C), and/or the like.

Additionally, a device described herein can include one or more additional vertical elements to control the electric field. For example, FIG. 7A shows an illustrative device 90 in which the drain electrode 92A is electrically connected to a bottom electrode 94A via a vertical connecting electrode 96A according to an embodiment. Furthermore, the bottom electrode 94A is shown extending from below the drain 44, across the spacing between the gate 46 and the drain 44, and under only a portion of the gate 46. The drain electrode 92A, vertical connecting electrode 96A, and bottom electrode 94A can be formed under and/or over the space-charge generating layer 18 in any of various shapes. For example, FIGS. 7B and 7C show illustrative alternative configurations of the electrodes according to embodiments. In FIG. 7B, the electrodes 92B, 96B, 94B form a smooth bend shape helping to achieve a higher breakdown voltage. In FIG. 7C, the electrodes 92C, 96C, 94C form an L-shape, which can be more readily manufactured as compared to the bend shape shown in FIG. 7B.

A device described herein also can include a gate having a V-groove shape (including a U shape). FIGS. 8A and 8B show illustrative devices 100A, 100B with V-groove gates 102A, 102B, respectively, according to embodiments. The gates 102A, 102B can be insulated using a layer of insulating material 104A, 104B, such as $Al_2O_3$, $Si_3N_4$, and/or the like. The V-groove shape can be obtained using any solution, e.g., etching a regrowth of epitaxial layers, and/or the like. The V-groove can be configured so that a top portion of the device channel (e.g., the p-type regrown GaN) contacts the source and drain, while a bottom portion of the device channel (e.g., the n-type GaN) contacts the space-charge generating layer 118A, 118B. Using a V-groove configuration, a length of the channel under the gate 102A, 102B is determined by a thickness of the p-type GaN layer rather than by lithographical methods. As a result, the device 100A, 100B can have a shorter channel length.

As illustrated in FIG. 8A, the space charge generating layer 118A can comprise a lightly doped n-type layer (e.g., n-GaN). The bottom electrode 120A is formed by a highly doped (e.g., (n+GaN) bottom portion 120A of the space-charge generating layer 118A. As illustrated in FIG. 8B, the space-charge generating layer 118B (e.g., an n-type GaN layer) can be grown on n-type SiC. A buffer layer can be located between the SiC and the space-charge generating layer 118B. The buffer layer can comprise a plurality of GaN or AlGaN epitaxial layers, which are epitaxially grown to reduce stress due to a lattice mismatch between the SiC and the GaN layer. As is further illustrated in FIG. 8B, a conducting and/or semiconducting substrate can be used to form the bottom electrode. For example, the n-type SiC can have a top portion, which is lightly doped and on which the buffer layer is grown, and a bottom portion that is highly doped to form the bottom electrode 120B.

A semiconductor described herein can be formed of any type of semiconductor material. Illustrative semiconductor materials include: silicon (Si), silicon carbide (SiC), germanium (Ge), zinc oxide (ZnO), various types of group III-V or II-VI compound materials, and/or the like. Illustrative group III-V materials include group III nitride materials, which include one or more group III elements (e.g., boron (B), aluminum (Al), gallium (Ga), and indium (In)) and nitrogen (N), such that $B_WAl_XGa_YIn_ZN$, where $0 \le W, X, Y, Z \le 1$, and $W+X+Y+Z=1$. Illustrative group III nitride materials include AlN, GaN, InN, BN, AlGaN, AlInN, AlBN, InGaN, GaBN, AlGaInN, AlGaBN, AlInBN, and AlGaInBN with any molar fraction of group III elements. Additional illustrative group III-V materials include GaAs, GaAlAs, InGaAs, indium phosphorus (InP), and/or the like. Similarly, a device described herein can be fabricated on a substrate formed of any of various types of compound semiconductor or dielectric materials, including, for example: sapphire; diamond; mica; ceramic; germanium (Ge); various types of group III nitride substrates including GaN, AlN, BN, AlGaN, AlGaInN, GaBN, AlBN, AlInBN, AlGaBN, and/or the like; $LiGaO_2$, $LiNbO_2$, ZnO; Si; SiC; GaAs; and/or the like. Furthermore, the substrate can comprise a conducting and/or semiconducting substrate.

Aspects of the invention are shown and described primarily with reference to a heterostructure field effect transistor. However, it is understood that aspects of the invention can be implemented in various types of field-effect transistors, including, for example, a field-effect transistor, a heterostructure field-effect transistor, an insulated gate field-effect transistor, an insulated gate heterostructure field-effect transistor, a multiple heterostructure field-effect transistor, a multiple heterostructure insulated gate field-effect transistor, an inverted field-effect transistor, an inverted heterostructure field-effect transistor, an inverted insulated gate field-effect transistor, an inverted insulated gate heterostructure field-effect transistor, an inverted multiple heterostructure field-effect transistor, an inverted insulated gate multiple heterostructure field-effect transistor, and/or the like. Additionally, as described herein, aspects of the invention can be implemented in other types of semiconductor devices, including for example, a diode of any type, a semiconductor resistor, a semiconductor sensor, a light emitting diode, a laser, an integrated element, and/or the like.

Figure 9:
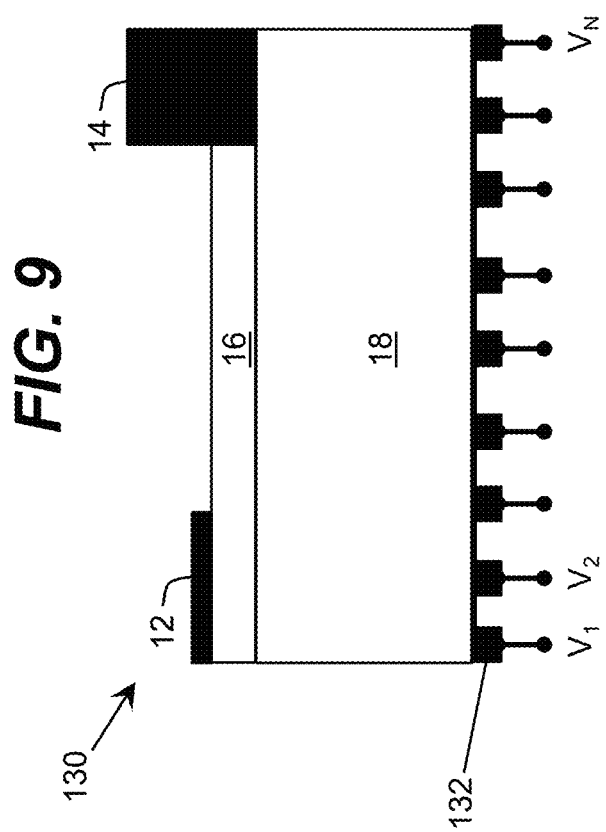
FIG. 9 shows an illustrative diode device having a set of electrodes connected to a space-charge generating layer according to an embodiment.

FIG. 9 shows an illustrative diode device 130 having a set of electrodes 132 connected to the space-charge generating layer 18 according to an embodiment. Like FIG. 3A, the diode device 130 can be configured to operate as a Schottky diode. In this embodiment, the diode device 130 can include a Schottky (source) contact 12 and an ohmic (drain) contact 14 to a device channel 16 in a lateral device geometry (lateral device contacts). The device channel 16 can be formed on a first side of an n-type space-charge generating layer 18 (e.g., a top surface of the space-charge generating layer 18). The set of electrodes 132 are attached to an opposing side of the space-charge generating layer 18 (e.g., a bottom surface of the space-charge generating layer 18). In an embodiment, the set of electrodes 132 can be ohmic or non-ohmic contacts to the space-charge generating layer 18, and also, can be a Schottky contact.

As shown in FIG. 9, each individual electrode 132 can be biased with a respective electric potential from one of the voltage sources $V_1, V_2, \ldots V_N$. In this manner, each electrode 132 can be individually biased to obtain the electric potential required to achieve a substantially uniform electric field in the device channel 16. In one embodiment, a substantially uniform field in the device channel 16 is obtained by applying linearly increasing voltages to each individual electrode 132. As an illustrative example, for the drain (or anode) voltage equal to Vd, and a total number of electrodes 132 equal to N, the voltage applied to electrode number "k" (numbered from the source contact 12 side to the drain contact 14 side) is equal to Vd*k/N. In an embodiment, a substantially uniform electric field is indicated when the electric field variation along the channel does not exceed 30% of the average electric field. However, embodiments can provide a more uniform electric field. Having a substantially uniform electric field in the device channel 16 results in the diode device 130 having a substantially maximum breakdown voltage for a given channel length. In particular, the maximum voltage that can be applied to a device is limited by the electric field anywhere in the device active region reaching the critical breakdown field. By making the electric field substantially uniform, the critical breakdown field is achieved simultaneously along substantially the entire channel length, thereby providing the maximum breakdown voltage.

It is understood that the diode device 130 is only illustrative of one type of diode configuration in which the set of electrodes 132 can used to control the electric field profile along and beneath the device channel 16 in order to attain a substantially uniform electric field that provides a maximum breakdown voltage for a given channel length. Those skilled in the art will appreciate that various types of diodes and diode configurations can be implemented according to embodiments described with respect to FIG. 9. For example, a junction diode, a MSM diode, and a $C^3$ diode are possibilities of diodes that can be configured with a set of electrodes that can be individually biased to obtain the electric potential necessary to achieve a substantially uniform electric field in the channel device.

Furthermore, it is understood that a diode is only illustrative of one type of device and device configuration which can be implemented with a set of individually biasable electrodes 132 to achieve a substantially uniform electric field in a channel device that facilitates a substantially maximum breakdown voltage. For example, FIG. 10A shows an illustrative device 134, which can be operated as a field-effect transistor having a set of electrodes 132 that can be controlled to achieve a substantially uniform electric field in a channel device, according to an embodiment. In this case, the device 134 is shown including a space-charge generating layer 18 and a device channel 16 (e.g., built in or induced) on which a set of lateral device contacts are located. The lateral device contacts include a source contact 42, a drain contact 44, and two gate contacts 46A, 46B. The gate contacts 46A, 46B are located on a top barrier layer 48 and a gate dielectric layer 50, which are located in the spacing between the source contact 42 and the drain contact 44.

The device 134 also can include an optional potential barrier formed between the set of electrodes 132 and the space-charge generating layer 18. For example, the device 134 is shown including a bottom barrier layer 52 disposed between the space-charge generating layer 18 and the set of electrodes 132. The bottom barrier layer 52 can form the potential barrier between the set of electrodes 132 and the space-charge generating layer 18 using any solution, e.g., a p-n junction (e.g., the barrier layer 52 is a p-type layer, while the space-charge generating layer 18 is an n-type layer), a heterojunction, and/or the like.

As described with respect to FIG. 9, each individual electrode 132 in FIG. 10A can be individually biased with a respective electric potential from one of the voltage sources $V_1, V_2, \ldots V_N$. In this manner, each electrode 132 can be individually biased to obtain the electric potential required to achieve a substantially uniform electric field in the device channel 16. Having a substantially uniform electric field in the device channel 16 results in the field effect transistor device 134 having a substantially maximum breakdown voltage for a given channel length.

FIG. 10B shows an illustrative field effect transistor device 136 having a set of electrodes 132 connected to the space-charge generating layer 18 according to another embodiment. The field effect transistor device 136 of FIG. 10B differs from the device 134 of FIG. 10A in that the field effect transistor device 136 includes a bias circuit 138 that can bias the set of electrodes 132. The bias circuit 138 can include one or more voltage sources (e.g., $V_1$, $V_2$) and a resistive divider 140 coupled to the electrodes through respective connectors. In this manner, the voltage sources $V_1, V_2$ can supply the voltage and the resistive divider 140 can provide the necessary electric potential to each of the electrodes 132. As a result, each electrode 132 can be individually biased to obtain the electric potential required to achieve a substantially uniform electric field in the device channel 16. Having a substantially uniform electric field in the device channel 16 results in the field effect transistor device 136 having a substantially maximum breakdown voltage for a given channel length.

In one embodiment, one or more of the bottom electrodes 132 can be grounded to reduce the number of voltage sources used in the bias circuit 138. For example, the left-most electrode 132 in FIG. 10B can be grounded such that $V_1=0$. The benefit of this configuration is in the reduced number of required voltage sources and simpler biasing circuit.

In one embodiment shown in FIG. 10B, the total resistance of the voltage supplying resistive divider 140 can be chosen to achieve an acceptable level of additional current consumed by the biasing circuit provided by the voltage source(s) ($V_1, V_2$). For example, assuming that a maximum current acceptable to flow through the divider 140 per general circuit and system requirements is $I_{DIVMAX}$, and $V_{21}$ is the voltage applied across the divider 140: $V_{21}=V_2-V_1$; then the total resistance of the divider 140 $R_{DIV}$ can be designed to meet the condition:

$$R_{DIV}=V_{21}/I_{DIVMAX}, \quad (5)$$

For example, in one embodiment, if $I_{DIVMAX}$ is assumed to equal 1 milliampere (mA) and $V_{21}$ equals 1000 V, then the resistance of the divider 140 is $R_{DIV}=V_{21}/I_{DIVMAX}=10^6$ Ohm.

FIG. 10C shows an illustrative field effect transistor device 142 having a low conducting electrode 144 connected to the space-charge generating layer 18 according to another embodiment. The field effect transistor device 142 of FIG. 10C is similar to the field effect transistor devices of FIGS. 10A-10B except that the set of electrodes depicted in FIGS. 10A-10B and the resistive divider 140 are replaced with the low conducting electrode 144 that therefore provides a continuously variable potential profile. As used herein, a low conducting electrode 144 can be viewed as a monolithic integration of the resistive divider 140 with an infinite number of individual resistors connected to an infinite number of infinitely small electrodes 132, thus providing a continuously variable potential profile as opposed to a "step-like" profile provided by the embodiments of FIGS. 10A-B.

Although FIG. 10C shows the low conducting electrode 144 as a singular material, those skilled in the art will appreciate that the electrode 144 can include multiple layers of a low conducting material or multiple layers of different layers of low conducting material that can provide a continuously variable potential profile. Examples of a low conducting electrode that are suitable for use in this embodiment can include, but are not limited to, low-doped layers of semiconductors, such as Si, poly-Si, amorphous Si, GaN and the like, very thin layers of metals such as Cr, Va, Ti, Al and the like, and semi-dielectric films such as TiO and the like.

FIG. 10C shows that one or more voltage sources ($V_1, V_2$) can provide the bias to the low conducting electrode 144. In this manner, the voltage sources ($V_1, V_2$) can supply the necessary electric potential to the low conducting electrode 144. Consequently, the low conducting electrode 144 can be biased as described above to obtain the electric potential required to achieve a uniform electric field along and underneath the device channel 16. As explained above, having a uniform electric field in the device channel 16 results in the field effect transistor device 136 having a maximum breakdown voltage for a given channel length.

In one embodiment, the space-charge generating layer 18 can be uniform or it may have variable resistivity and/or thickness. As a result, the total resistance of the low conducting electrode 144, and hence, the sheet resistance of the low-conducting material used for the low conducting electrode 144 can be chosen to achieve an acceptable level of additional current consumed by the voltage source(s) (V1, V2) biasing the space-charge generating layer 18. For example, assuming that a maximum current acceptable to flow through the low-conducting electrode 144 attached to the space-charge generating layer 18 per general circuit and system requirements is $I_{LCEMAX}$, and $V_{LCE}$ is the voltage applied to the low-conducting electrode, then the resistance of the low-conducting electrode $R_{LCE}$ can be designed to meet the condition: specified above in equation (5). In one embodiment, if $I_{LCEMAX}$ is assumed to equal 1 microampere (μA), and $V_{LCE}$ equals $V_2$ minus $V_1$, then the resistance $R_{LCE}$ of the low-conducting electrode 144 can be designed to meet the condition: $R_{LCE}=V_{LCE}/I_{LCEMAX}$ for the embodiment shown in FIG. 10C.

In one embodiment, one of the contacts to the low conducting electrode 144 can be grounded to reduce the number of voltage sources used to bias the space-charge generating layer 18. For example, the left-most contact of the low conducting electrode 144 can be grounded such that $V_1=0$. This results in a simpler biasing circuit for the embodiment.

FIG. 10D shows an illustrative field effect transistor device 146 having a low conducting electrode 148 and a vertical connecting electrode 96A connected to the space-charge generating layer 18 according to another embodiment. Besides the use of the electrode 148 and the vertical connecting electrode 96A, the field effect transistor device 146 differs from those devices illustrated in FIGS. 10A-10C in that it does not utilize a barrier layer 50 to separate the space-charge generating layer 18 from the electrode 148. In addition, the field effect transistor device 146 is illustrated having only one gate electrode 46.

As shown in FIG. 10D, the drain electrode 92A of the field effect transistor device 146 is electrically connected to a bottom portion of the space-charge generating layer 18 via the vertical connecting electrode 96A. The vertical connecting electrode 96A connects to a side portion of the device channel 16 in addition to the space-charge generating layer 18. In one embodiment, the electrode 148 can be a low conducting electrode of the type described with respect to the one utilized in FIG. 10C. The electrode 148 connects to the bottom portion of the space-charge generating layer 18 without contacting the electrode 96A. Having a space between the electrode 148 and the electrode 96A at the bottom portion of the space-charge generating layer 18 serves to prevent the leakage current flowing from the electrode 148 into space-charge generation layer and further into device active region. It is understood that the length that the electrode 96A and the electrode 148 extend along a bottom surface of the space-charge generating layer 18 is variable as is the distance that can separate the two from each other. Furthermore, it is understood that the vertical connecting electrode 96A, and the electrode 148 can be formed under and/or over the space-charge generating layer 18 and each can be in the form of one of many various shapes. Also, those skilled in the art will appreciate that the low conducting electrode 148 can be replaced by a set of multiple electrodes that are used to provide the bias to the space generating layer 18. For example, the multiple electrode configurations illustrated for FIGS. 10A-10B can be used in place of the electrode 148.

In operation, one or more voltage sources ($V_1, V_2$) can provide the bias to the low conducting electrode 148. In this manner, the voltage sources ($V_1, V_2$) can supply the necessary electric potential to the low conducting electrode 148, while the vertical connecting electrode 96A serves to reduce the voltage across the vertical surface of the device, thus preventing premature breakdown along this surface. Consequently, the low conducting electrode 148 can be biased as described above to obtain the electric potential required to achieve a substantially uniform electric field along and underneath the device channel 16. Having a uniform electric field along and underneath the device channel 16 results in the field effect transistor device 146 having a substantially maximum breakdown voltage for a given channel length.

Figure 11:
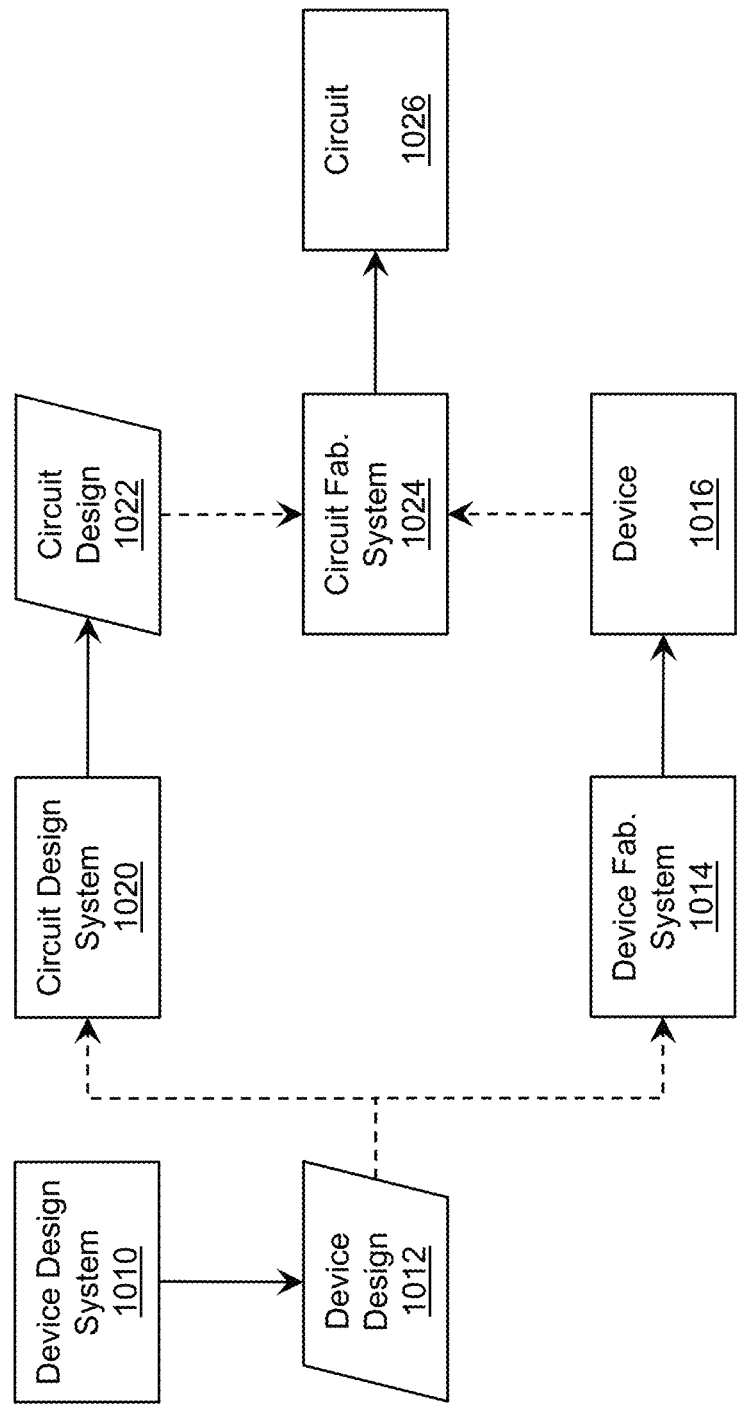
FIG. 11 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 11 shows an illustrative flow diagram for fabricating a circuit 1026 according to an embodiment. Initially, a user can utilize a device design system 1010 to generate a device design 1012 for a semiconductor device as described herein. The device design 1012 can comprise program code, which can be used by a device fabrication system 1014 to generate a set of physical devices 1016 according to the features defined by the device design 1012. Similarly, the device design 1012 can be provided to a circuit design system 1020 (e.g., as an available component for use in circuits), which a user can utilize to generate a circuit design 1022 (e.g., by connecting one or more inputs and outputs to various devices included in a circuit). The circuit design 1022 can comprise program code that includes a device designed as described herein. In any event, the circuit design 1022 and/or one or more physical devices 1016 can be provided to a circuit fabrication system 1024, which can generate a physical circuit 1026 according to the circuit design 1022. The physical circuit 1026 can include one or more devices 1016 designed as described herein.

In another embodiment, the invention provides a device design system 1010 for designing and/or a device fabrication system 1014 for fabricating a semiconductor device 1016 as described herein. In this case, the system 1010, 1014 can comprise a general purpose computing device, which is programmed to implement a method of designing and/or fabricating the semiconductor device 1016 as described herein. Similarly, an embodiment of the invention provides a circuit design system 1020 for designing and/or a circuit fabrication system 1024 for fabricating a circuit 1026 that includes at least one device 1016 designed and/or fabricated as described herein. In this case, the system 1020, 1024 can comprise a general purpose computing device, which is programmed to implement a method of designing and/or fabricating the circuit 1026 including at least one semiconductor device 1016 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1010 to generate the device design 1012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1010 for designing and/or a device fabrication system 1014 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method comprising:
    designing a lateral semiconductor device comprising:
        a device channel;
        a first contact on a first end of the device channel;
        a second contact on a second end of the device channel, wherein the second end is opposite the first end, and wherein the first and second contacts are located on a first side of the device channel;
        a space-charge generating layer located on a second side of the device channel opposite the first side; and
        a set of electrodes electrically connected to the space-charge generating layer and located on an opposite side of the space-charge generating layer as the device channel, wherein the designing includes selecting a set of attributes for the space-charge generating layer such that the space-charge generating layer is configured to form a space-charge region to at least partially deplete the device channel in response to an operating voltage being applied to the first contact and the second contact; and
    fabricating the lateral semiconductor device according to the design.

2. The method of claim 1, wherein the selecting includes selecting a thickness of the space-charge generating layer to provide complete depletion of the device channel at a maximum operating voltage of the device and to prevent breakdown in the space-charge generating layer.

3. The method of claim 1, wherein the selecting includes selecting a doping level and a doping profile in the space-charge generating layer to provide complete depletion of the device channel at a maximum operating voltage of the device.

4. The method of claim 1, wherein the device is a field-effect transistor, the device further including at least one gate contact to the device channel located on the first side of the device channel, and wherein the space-charge generating layer includes an embedded region located under at least one of the at least one gate contact, wherein the selecting includes selecting a doping level in the embedded region to deplete the device channel under the at least one of the at least one gate contact at a zero gate bias.

5. The method of claim 1, wherein the fabricating includes forming the second contact and the set of electrodes such that the electrodes are electrically connected to the second contact, wherein the set of electrodes contact a portion of bottom surface of the space-charge generating layer and a surface of one side the space-charge generating layer.

6. A lateral semiconductor device comprising:
a device channel;
a first contact on a first end of the device channel;
a second contact on a second end of the device channel, wherein the second end is opposite the first end, and wherein the first and second contacts are located on a first side of the device channel;
a space-charge generating layer located on a second side of the device channel opposite the first side; and
a set of electrodes electrically connected to the space-charge generating layer and located on an opposite side of the space-charge generating layer as the device channel, wherein the space-charge generating layer has a set of attributes configured to form a space-charge region to at least partially deplete the device channel in response to an operating voltage being applied to the first contact and the second contact.

7. The device of claim 6, wherein the space-charge generating layer is configured such that the space-charge region completely depletes the device channel at a maximum operating voltage of the device.

8. The device of claim 6, wherein the device is a diode.

9. The device of claim 6, wherein the set of electrodes are non-ohmic contacts to the space-charge generating layer.

10. The device of claim 6, wherein at least one of: the first contact or the second contact, is electrically connected to the set of electrodes.

11. The device of claim 6, further comprising a heat sink disposed under the set of electrodes.

12. The device of claim 11, further comprising a heat spreading layer disposed between the heat sink and the set of electrodes.

13. The device of claim 6, wherein the device is a field-effect transistor, the device further including at least one gate contact to the device channel located on the first side of the device channel.

14. The device of claim 13, wherein the at least one gate contact includes a V-groove shape.

15. The device of claim 14, wherein the device channel includes a top portion and a bottom portion each having a V-groove shape with ends that connect with a source contact and a drain contact, wherein the bottom portion of the device channel has a region contacting the space charge generating layer.

16. The device of claim 15, further comprising an insulating layer disposed between the gate contact and the top portion of the device channel.

17. A circuit comprising:
a lateral semiconductor device comprising:
a device channel;
a first contact on a first end of the device channel;
a second contact on a second end of the device channel, wherein the second end is opposite the first end, and wherein the first and second contacts are located on a first side of the device channel;
a space-charge generating layer located on a second side of the device channel opposite the first side; and
a set of electrodes electrically connected to the space-charge generating layer and located on an opposite side of the space-charge generating layer as the device channel;
a input circuit electrically connected to the first contact; and
an output circuit electrically connected to the second contact, wherein the space-charge generating layer has a set of attributes configured to form a space-charge region to at least partially deplete the device channel in response to an operating voltage being applied to the first contact and the second contact.

18. The circuit of claim 17, wherein the device is a field-effect transistor, the device further including at least one gate contact to the device channel located on the first side of the device channel, and the circuit further including a control circuit electrically connected to the at least one gate contact.

19. The circuit of claim 18, wherein the at least one gate contact includes a V-groove shape, and wherein the device channel includes a top portion and a bottom portion each having a V-groove shape with ends that connect with a source contact and a drain contact, wherein the bottom portion of the device channel has a region contacting the space charge generating layer.

20. The circuit of claim 18, wherein the first contact comprises a source contact of the field-effect transistor and wherein the circuit is configured to apply a same voltage to the source contact and the set of electrodes.

* * * * *